(12) United States Patent
Kodama et al.

(10) Patent No.: US 6,516,439 B2
(45) Date of Patent: Feb. 4, 2003

(54) ERROR CONTROL APPARATUS AND METHOD USING CYCLIC CODE

(75) Inventors: Yukio Kodama, Hyogo (JP); Takeshi Kyomoto, Hyogo (JP)

(73) Assignee: Mitsubishi Denki Kabushiki Kaisha (JP)

( * ) Notice: Subject to any disclaimer, the term of this patent is extended or adjusted under 35 U.S.C. 154(b) by 0 days.

(21) Appl. No.: 09/899,062

(22) Filed: Jul. 6, 2001

(65) Prior Publication Data

US 2001/0056563 A1 Dec. 27, 2001

Related U.S. Application Data

(63) Continuation of application No. PCT/JP99/06360, filed on Nov. 15, 1999.

(51) Int. Cl.$^7$ .......................... H03M 13/00; G06F 11/00
(52) U.S. Cl. ...................... 714/758; 714/701; 714/746; 714/781
(58) Field of Search ................................. 714/758, 746, 714/701, 716, 750, 752, 754, 759, 761, 774, 786, 794, 797, 796, 795; 375/262, 259, 341; 341/143

(56) References Cited

U.S. PATENT DOCUMENTS 6,269,124 B1 * 7/2001 Nagayasu et al. .......... 375/262

FOREIGN PATENT DOCUMENTS

| JP | 8-265304 | 10/1996 |
|---|---|---|
| JP | 10-200417 A | 7/1998 |
| JP | 11-136218 A | 5/1999 |

* cited by examiner

Primary Examiner—Emmanuel L. Moise
(74) Attorney, Agent, or Firm—Rothwell, Figg, Ernst & Manbeck

(57) ABSTRACT

An error control apparatus includes: a deinterleaver for deinterleaving data of a predetermined number of bits coded by predetermined cyclic codes, which is to be interleaved in accordance with a predetermined interleaving order; a first cyclic code checking circuit for receiving an output of the deinterleaver and making a cyclic code check on the data of the predetermined number of bits by a check system corresponding to a coding system of the cyclic code; and a second cyclic code checking circuit for receiving an output of the deinterleaver and making a cyclic code check on the data of the predetermined number of bits by a check system corresponding to the coding system of the cyclic code simultaneously with the cyclic code check by the first cyclic code checking circuit in substantially the same time while canceling an interleave effect by the deinterleaver.

14 Claims, 11 Drawing Sheets

ND METHOD USING CYCLIC CODE

ERROR CONTROL APPARATUS AND METHOD USING CYCLIC CODE

REFERENCE TO RELATED APPLICATION

This Application is a continuation of International Application No. PCT/JP99/06360, whose international filing date is Nov. 15, 1999, the disclosure of which is incorporated by reference herein. The present application has not been published in English.

BACKGROUND OF THE INVENTION

1. Field of the Invention

The present invention relates to an error control apparatus and method using a cyclic code in communication, and more particularly, to an error control apparatus and method using a communication system that may switch between communication using data interleaving and communication not using data interleaving.

2. Description of the Background Art

In recent years, communication devices using radio communication such as a portable telephone is being widespread. The radio communication does not require a telephone line or the like in an ordinary telephone system and can be performed by providing base stations in proper places. Consequently, the radio communication is most suitable to use in an area where cost of laying a telephone line seems to be excessive. Moreover, since locations where communication can be conducted are not always limited, the radio communication is expected to be more widely used in the future.

In the radio communication, digital communication is mainly used. Particularly, in the radio communication, for example, in order to protect privacy of conversation by telephone, it is preferable to use the digital communication.

In the digital communication, there is a case such that an error control system in which a coding system using an error correcting code and a CRC code are combined is used. Particularly, as seen in a part of the standards of recent portable telephone systems, at the time of transmission from a base station to a mobile station, when the state of communication is seen from the mobile station and the quality of a radio line is good, a CRC code obtained by CRC which does not perform interleaving is added to data and the resultant is transmitted. When the quality of the radio line is not good, data is coded by an error correcting code, and a CRC code obtained by the CRC performing interleaving is added to data. In such a manner, there is a case that the system of the CRC code changes according to the line quality.

Data that is not interleaved includes, like reception data 120 shown in FIG. 9, 224 bits of data $D_0$ to $D_{223}$ (208 bits of data from $D_0$ to $D_{207}$ and 16 bits of CRC bits from $D_{208}$ to $D_{223}$). The data bits are sequentially transmitted in accordance with the order. The data is stored into a reception buffer in this order, sequentially read in this order, and decoded for an error control by the CRC. As an example, the code length of 224 bits, 16-bit CRC, and 16-stage interleaving are assumed here.

Referring to FIG. 10, reception data 130 is interleaved not in the order of $D_0$ to $D_{223}$ but in the order of $D_0$, $D_{16}$, $D_{32}$, ..., $D_{209}$, $D_1$, $D_{17}$, $D_{33}$, ..., $D_{210}$, ..., $D_{222}$, $D_{15}$, $D_{31}$, $D_{47}$, ..., $D_{207}$, $D_{223}$. The interleaved reception data 130 is transmitted, read in this order as shown by arrows 132, and decoded for an error control by the CRC. Particularly, such interleaving is performed by adding an error correction signal when line quality is poor.

Data formatting with/without interleaving is done on the base station side. A mobile unit cannot know whether data received from the base station is interleaved data or not. Conventionally, the mobile unit performs error detection by a CRC circuit on the assumption that the received data is interleaved. When there is no error, it is determined that the received data is in an interleaved format and the process is continued. When there is an error, it is determined that the received data is in a format without interleaving. The mobile unit regards the data as data that is not interleaved and performs error detection again by the CRC circuit. When a CRC error is further detected in the process, a proper error process such as retransmission of data is performed. When the error correcting code is added, error correction by the error correcting code is also conducted at this time. A technique of transmitting data by adding the error correcting code is called an FEC (Forward Error Correction), and a circuit for the FEC is called an FEC circuit. Since the invention relates to a CRC decoding process and does not relate to the FEC, in order to make the description regarding the invention clear, the FEC will not be considered in the following description.

An example of a circuit for realizing the above-described CRC process is shown in FIG. 7. Referring to FIG. 7, a conventional error control decoding unit 90 includes: a reception data buffer 50 for storing data received from a base station; a deinterleaver 52 for deinterleaving data by reading data in accordance with a predetermined order on the assumption that data stored in the reception data buffer 50 is interleaved data (in an interleave format); an FEC 54 for receiving an output of the deinterleaver 52; an FEC 56 for receiving data read directly from the reception data buffer 50; a selector 100 for selecting and outputting either data of the FEC 56 or data of the FEC 54; and a CRC circuit 58 for receiving an output of the selector 100 and calculating CRC of the data.

Referring to FIG. 11, as is well known, the CRC circuit 58 includes: a plurality of 1-bit registers CR0 to CR15 that are connected in series so as to sequentially shift data (the number of the 1-bit registers is determined by a CRC generation polynomial); adders 142 and 144 each inserted in front of the 1-bit register in a position corresponding to a coefficient except for 0 in coefficients in each term in the CRC generation polynomial, for performing addition by using 2 as a modulus between data supplied via a data line 140 and an output of the immediately preceding 1-bit register and supplying the result to the immediately following 1-bit register; and an adder 146 for performing addition using 2 as a modulus between input data and an output of the last 1-bit register CR15 and supplying the result to the head 1-bit register CR0 and the adders 142 and 144 via the data line 140. FIG. 11 shows the CRC circuit corresponding to the following generation polynomial.

$$g(x) = x^{16} + x^{22} + x^5 + 1$$

The CRC circuit is substantially a dividing circuit.

In the CRC circuit, a predetermined initial value is set in each of the 1-bit registers in the beginning, reception data is supplied as input data bit by bit, and the value is sequentially shifted by the 1-bit registers. When all of bits are inputted, the values held in the 1-bit registers CR0 to CR15 are a reminder of division, that is, CRC bits. Usually, when the CRC bit is 0, it is determined that there is no error. When the CRC bit is not 0, it is determined that an error occurs.

The error detection using the circuit is performed by processes shown in the flowchart of FIG. 12. Specifically, a mobile unit is started to receive a unit (step S2). Assuming first that the reception data are interleaved, data deinterleaved via the deinterleaver 52 shown in FIG. 7 is selected by the selector 100 and is subjected to the CRC process in the CRC circuit 58 (step S30). As a result, if there is no CRC error, the control advances to step 8 and if there is a CRC error, the control advances to step S34 (determination in step S32).

When there is no CRC error, it means that data transmitted from the base station is interleaved. Consequently, a receiving process is performed on the condition that the data is interleaved. Specifically, first, in step S8, whether the unit received in step S2 is the head unit or not is determined. When it is not the head unit, the unit is discarded in step S14, and the control returns to step S2.

When it is determined in step S8 that the unit received in step S2 is a head unit, in step S10, it is determined that the data is interleaved one, a following unit is received, and the CRC process is performed on the following unit. That is, in the subsequent processes, the selector 100 selects an output of the FEC 54. Subsequently, in step S12, whether there is a following unit or not is determined. If YES, the control returns to step S10 and the process of receiving the following unit is continued. When it is determined in step S12 that there is no following unit, the control returns to step S2.

On the other hand, when it is determined in step S32 that there is a CRC error, it is determined that the data is not interleaved. In step S34, therefore, on the assumption that the data is not interleaved, the CRC process is performed. In the example shown in FIG. 7, the data is read again from the reception data buffer 50. The data sent via the FEC 56 is selected this time by the selector 100 and is supplied to the CRC circuit 58. Whether there is a CRC error or not as a result of the CRC process by the CRC circuit 58 is determined in step S36. When there is no CRC error, it is determined that the data received in step S2 is non-interleaved data, and the control moves to step S18. When there is a CRC error, without doing anything (that is, the reception unit is discarded), the control returns to step S2.

Since processes in steps S18 to S24 performed when it is determined that there is no CRC error in step S36 are similar to those in steps S8 to 14, respectively, the detailed description will not be repeated here. Step S20 is different from step S10 in that the CRC process is performed on the assumption that the reception data is non-interleaved data.

FIG. 8 shows another conventional error control decoding unit 110 for performing processes similar to those of the conventional error control decoding unit 90 shown in FIG. 7. In the example as well, first, it is assumed that reception data is interleaved, data read from the reception data buffer 50 and deinterleaved by the deinterleaver 52 is passed via the FEC 54 to a CRC circuit 58A and is subjected to a CRC process. When there is a CRC error as a result, it is determined that the data is no-interleaved data. Data is newly read from the reception data buffer 50 and, at this time, data that is not deinterleaved is sent via the FEC 56 to a CRC circuit 58B separate from the CRC circuit 58A and is subjected to the CRC process. In the example shown in FIG. 7, the single CRC circuit 58 is obtained by combining the two CRC circuits 58A and 58B shown in FIG. 8.

However, whether the data received as described above is interleaved or not cannot be determined without performing the CRC process once. First, on the assumption that the data is interleaved one, the read data is always deinterleaved and processed. When the data is actually non-interleaved one, the data has to be newly read, directly from the reception data buffer and has to be CRC processed. As a result, there is a case that data has to be read twice from the reception data buffer, and processing time corresponding to the process of twice is required. The CRC calculation is executed twice. Consequently, the system load on the mobile unit increases, and there is a problem such that the power consumption of the mobile unit increases. Since the power of the mobile unit is limited, it is preferable to suppress the power consumption as much as possible.

It is therefore an object of the present invention to provide an error control circuit and method which can reduce power consumption in an error control apparatus and method for conducting a cyclic code check on data which is whether interleaved one or not is not known in advance.

Another object of the present invention is to provide an error control circuit and method capable of determining whether data is interleaved one or not by reading data only once from a reception data buffer.

Further another object of the present invention is to provide an error control circuit and method capable of determining whether data is interleaved one or not at high speed by reading data only once from a reception data buffer.

SUMMARY OF THE INVENTION

An error control circuit according to the present invention includes: a deinterleaver for deinterleaving data of a predetermined number of bits coded by predetermined cyclic codes and to be interleaved in accordance with a predetermined interleave order; a first cyclic code checking circuit for receiving an output of the deinterleaver and conducting a cyclic code check on the data of the predetermined number of bits by a check system corresponding to a coding system of the cyclic code; and a second cyclic code checking circuit for receiving an output of the deinterleaver and conducting a cyclic code check on the data of the predetermined number of bits by a check system corresponding to the coding system of the cyclic code simultaneously with the cyclic code check by the first cyclic code checking circuit in substantially the same time while canceling an interleave effect by the deinterleaver.

Simultaneously with the cyclic code check by the first cyclic code checking circuit in substantially the same time, the cyclic code check is conducted by the second cyclic code checking circuit while canceling an interleave effect by the deinterleaver. Consequently, when data before being subjected to deinterleave is interleaved data, the CRC is conducted by the first cyclic code checking circuit. When data before being subjected to deinterleave is non-interleave data, the CRC is conducted by the second cyclic code checking unit. Since the two kinds of cyclic code checks can be made by reading data only once at the time of deinterleave, the time required for the cyclic code check is shortened, and the load for calculation is also reduced. As a result, the power consumption of the error control apparatus is reduced.

Preferably, the second cyclic code checking circuit includes: an input data line connected to an output of the deinterleaver; a data bus including data signal lines of the number corresponding to the maximum degree of a polynomial of generating the cyclic code; a plurality of partial check bit calculating circuits each connected to the input data line and the data signal line, which are provided in correspondence with the maximum degree of a polynomial of generating the cyclic code, for calculating a check bit in a predetermined position of the cyclic code by executing a predetermined computation sequence determined by the coding system of the cyclic code and a system of the interleave on data supplied from the input data line and data on the data signal line; and a computation control unit connected to each of the plurality of partial check bit calculating circuits, for controlling the computation sequence to be performed by the partial check bit calculating circuits.

More preferably, each of the plurality of partial check bit calculating circuits includes: a computating unit connected to the computation control unit, the input data line, and the data bus, for executing a computation determined by a computation instruction signal supplied from the computation control unit on data on the input data line and data on a predetermined data line on the data bus; a data register having an input connected to an output of the computating unit and an output connected to a predetermined data line on the data bus, for holding data outputted from the computating unit and outputting the data onto the predetermined data line; and a computation result register connected to an output of the data resistor, for executing a computation using 2 as a modulus between data held by itself and an output of the data register each time computations of the number corresponding to a number obtained by dividing the predetermined number of bits by the number of stages of the interleave are finished.

An error control method according to another aspect of the invention includes: a step of deinterleaving data of a predetermined number of bits coded by predetermined cyclic codes and to be interleaved in accordance with a predetermined interleaving order; a step of receiving data deinterleaved in the deinterleaving step, and conducting a first cyclic code check on the data of the predetermined number of bits by a check system corresponding to a coding system of the cyclic code; and a step of receiving the deinterleaved data and conducting a second cyclic code check on the data of the predetermined number of bits by a check system corresponding to the coding system of the cyclic code simultaneously with the step of conducting the first cyclic code check in substantially the same time.

Simultaneously with the first cyclic code check on the deinterleaved data in substantially the same time, the second cyclic code check is conducted while canceling an interleave effect by the deinterleaver. Consequently, when data before being subjected to deinterleave is interleaved data, the CRC is conducted by the first cyclic code check. When data before being subjected to deinterleave is non-interleave data, the CRC is conducted by the second cyclic code check. Since the two kinds of cyclic code checks can be made by reading data only once at the time of deinterleave, the time required for the cyclic code check is shortened, and the load for calculation is also reduced. As a result, the power consumption of the error control apparatus is reduced.

More preferably, the step for conducting the second cyclic code check includes: a step of initializing a plurality of temporary cyclic check data registers of the number corresponding to the maximum degree of a polynomial of generating the cyclic code; and a step of calculating a check bit in each of positions of the cyclic codes by performing a computation sequence made by a plurality of clock cycle computations determined by a coding system of the cyclic code and the interleave system on data deinterleaved in the deinterleaving step while using the plurality of temporary cyclic check data registers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
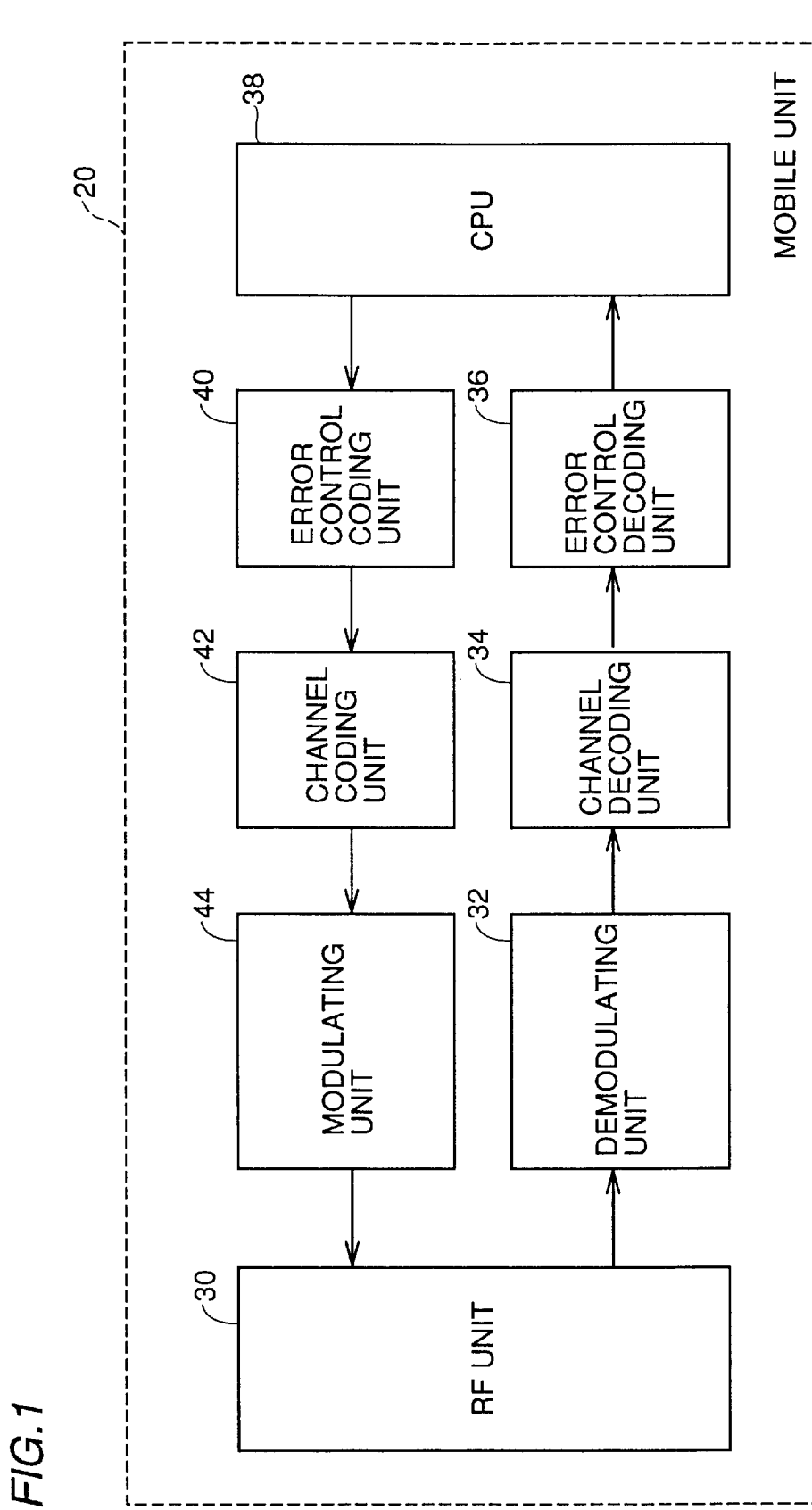
FIG. 1 is a block diagram of a mobile unit in a radio telephone system of an embodiment of the invention.

Referring to FIG. 1, a mobile unit 20 according to a preferred embodiment of the invention includes: an RF unit 30 for conducting radio communication with a base station; a demodulating unit 32 for demodulating a signal from the base station, which is received by the RF unit 30; a channel decoding unit 34 connected to an output of the demodulating unit 32, for performing a channel decoding process; an error control decoding unit 36 for performing error detection by CRC or the like, error correction using an error correcting code and the like on data subjected to the channel decoding process; a CPU 38 for controlling basic operations on the entire mobile unit 20 and also other circuit portion (not shown); an error control coding unit 40 for performing an error control coding process such as addition of a CRC code to data which is outputted from the CPU 38 and is to be transmitted to the base station; a channel coding unit 42 for conducting channel coding on the data coded by the error control code outputted from the error control coding unit 40; and a modulating unit 44 for modulating an output of the channel coding unit 42 at a radio frequency.

Figure 2:
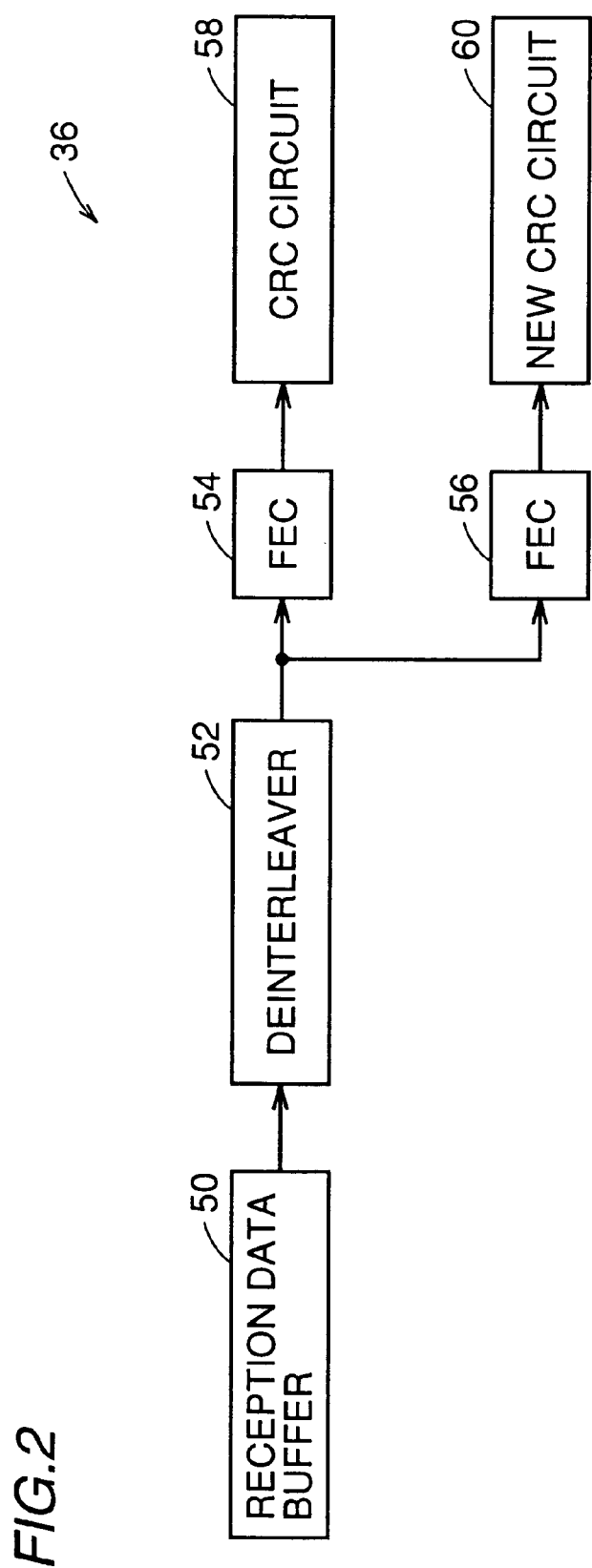
FIG. 2 is a block diagram of an error control decoding unit 36 in the radio telephone system of the embodiment of the invention.

Referring to FIG. 2, the error control decoding unit 36 includes: a reception data buffer 50 for storing data received from the base station; a deinterleaver 52 for deinterleaving data by reading the data from the reception data buffer 50 in accordance with a predetermined order (indicated by arrows 132 in FIG. 10); an FEC 54 connected to an output of the deinterleaver 52; a CRC circuit 58 connected to an output of the FEC 54; an FEC 56 connected to an output of the deinterleaver 52; and a new CRC circuit 60 which is connected to the output of the FEC 56 and has the function of performing a CRC process concurrently with the CRC circuit 58 even when data to be deinterleaved is in a non-interleaving format in the reception data buffer 50.

Figure 11:
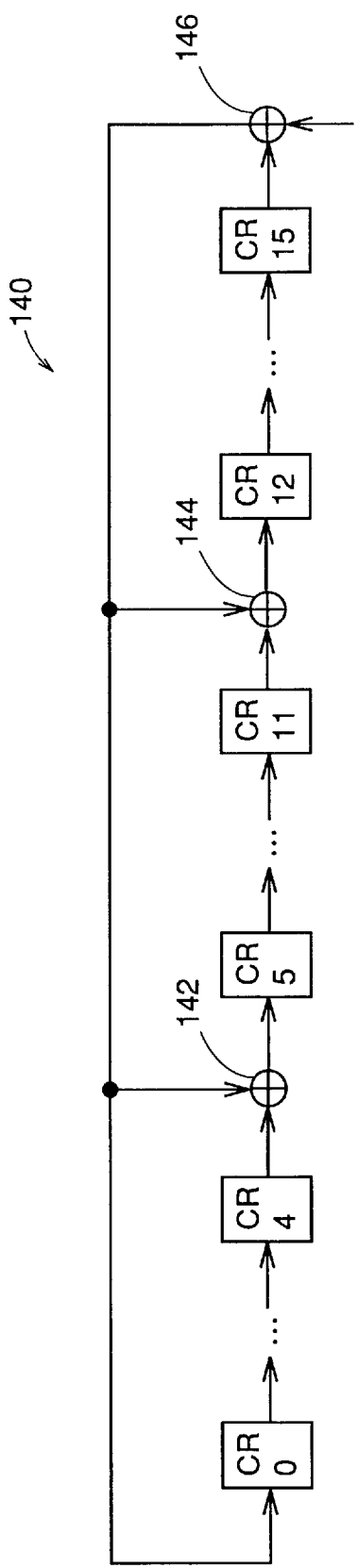
FIG. 11 is a block diagram showing a CRC calculating circuit.

The CRC circuit 58 is similar to that shown in FIG. 11. The new CRC circuit 60 is a part related to the present invention. The new CRC circuit 60 can obtain the same result with respect to data obtained by deinterleaving non-interleaved data as data supplied without being interleaved. By providing the new CRC circuit 60, a CRC check can be conducted on non-interleaved data by the new CRC circuit 60 in parallel with a CRC check conducted on data read from the reception data buffer 50 and deinterleaved by the deinterleaver 52. Consequently, it is sufficient to read data from the reception data buffer 50 once, the load on the CRC calculation decreases, and the power consumption can be reduced.

Before describing the configuration of the new CRC circuit 60, the principle of the process performed by the new CRC circuit 60 will be described.

Figure 9:
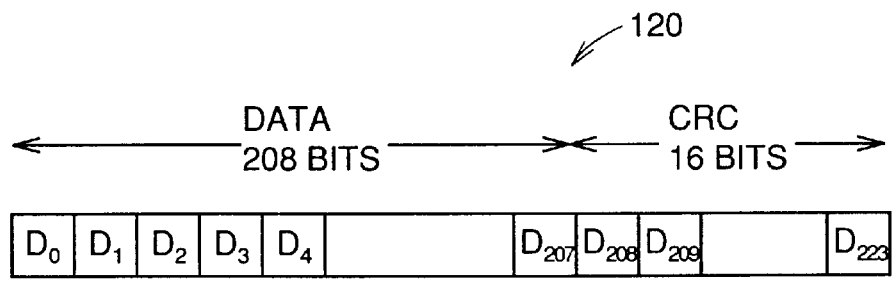
FIG. 9 is a diagram showing non-interleaved data.

A non-interleaved data format is as shown in FIG. 9. A CRC reception polynomial F is as shown by the following equation (1).

$$F=D_0 x^{223}+D_1 x^{222}+D_2 x^{221}+\ldots+D_{207} x^{16}+D_{208} x^{15}+D_{209} x^{14}+\ldots+D_{223} x^0 \quad (1)$$

Figure 10:
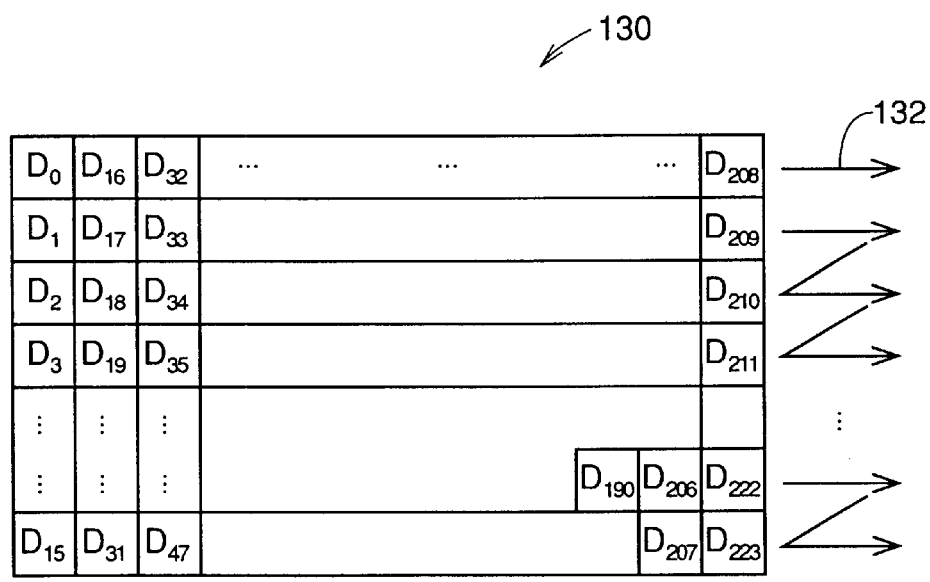
FIG. 10 is a diagram showing interleaved data.

On the other hand, an interleaved data format is as shown in FIG. 10 and the CRC reception polynomial is as shown by the following equation (2).

$$D^{223}+D_{16} x^{222}+D_{32} x^{221}+\ldots+D_{208} x^{210}$$
$$+D_1 x^{209}+D_{17} x^{208}+D_{33} x^{207}+\ldots+D_{209} x^{196}$$
$$+D_2 x^{195}+D_{18} x^{194}+D_{34} x^{193}+\ldots+D_{210} x^{182}\ldots$$
$$+D_{14} x^{29}+D_{30} x^{28}+D_{46} x^{27}+\ldots+D_{190} x^{16}+D_{206} x^{15}+D$$
$$222 x^{14}+D_{15} x^{13}+D_{31} x^{12}+D_{47} x^{11}+D_{223} x^0 \quad (2)$$

When the equation (1) is expressed so as to be adapted to an interleave (16-stage) format, it can be decomposed into 16 partial data F1 to F16 as follows.

$$F=\sum_{i=1}^{16} Fi \quad (3)$$

$$Fi=\sum_{j=0}^{15} D_{(j \times 16+i-1)} x^{223-(j \times 16+i-1)} \quad (4)$$

The CRC (adapted to the non-interleaving format) to be obtained is a remainder derived when the equation (3) is divided by the CRC polynomial. When the CRC (adapted to the non-interleaving format) to be obtained is CRC(x), since the CRC code is a linear code, the following equation (5) is satisfied by the distributive law.

$$CRC(x) = F(x) \bmod G(x) \quad (5)$$
$$= \sum_{j=1}^{16} Fi(x) \bmod G(x)$$

With respect to the above expression Fi (i=1 to 16), when it is seen from higher-order of x, the appearing order of the coefficients $D_0$ to $D_{223}$ of each term is the same as that of the coefficients $D_0$ to $D_{223}$ of each term in the equation (2) in the case of an interleaving data format. The degree of x in a term in the equation (1) and that in the corresponding term in the equation (2) are different from each other. It is noted that the degree of x decreases by one in the equation (2) but, in contrast, in the equation (1), the degree of x decreases by 16, which is the number of interleaving stages.

In order to make the principle of the invention more clearly, the equation F1 can be further expand as follows.

$$F1=D_0 \cdot x^{223}+0 \cdot X^{222}+0 \cdot x^{221}+0 \cdot x^{220}+0 \cdot x^{219}+$$
$$0 \cdot x^{218}+0 \cdot x^{217}+0 \cdot$$
$$x^{216}+0 \cdot x^{215}+0 \cdot x^{214}+0 \cdot x^{213}+0 \cdot x^{212}+0 \cdot x^{211}+$$
$$0 \cdot x^{210} 0 \cdot x^{209}+$$
$$0 \cdot x^{208}+D_{16} x^{207}+\ldots+D_{192} x^{31}+D_{208} x^{15} \quad (3)$$

The equations (3) and (2) will be compared with each other. It is assumed that, for the period of 15 clocks from the input of the first term $D_0$ to the input of the second term deinterleaved data $D_{16}$, data of "0" is supplied and, similarly, for the period of 15 clocks from the input of each term data $D_i$ to the input of the next data $D_{i+1}$, data of "0" is supplied, the equation (2) has a form matching with that of the equation (3).

The same holds for F2 to F16. Only the final term of each of F2 to F16 has to be adjusted as follows. For example, the final term $D_{209} x^{14}$ of F2 is adjusted as follows.

$$D_{209} x^{14}=D_{209}+x^{14}+0 \cdot x^{13}+0 \cdot x^{12}+0 \cdot x^{11}+0 \cdot x^{10}+0 \cdot x^9+0 \cdot x^8+0 \cdot^7+0 \cdot x^6+$$
$$0 \cdot x^5+0 \cdot x^4+0 \cdot x^3+0 \cdot x^2+0 \cdot x^1+0 \cdot x^0$$

In the equation, the first term in the 15 terms is $D_{209} x^{14}$, and it can be considered that data of "0" is entered in the remaining 14 terms. Similarly, the final term $D_{222} x^1$ of F15 and the final term $D_{223} x^0$ of F16 are adjusted as follows.

$$D_{222} x^1 = D_{222} x^1 + 0 \cdot x^0$$
$$D_{223} x^0 = D_{223} x^0$$

When it is regarded that data "0" is entered only in one dock cycle after $D_{222}$ in F15 and no data is entered after $D_{223}$ in F16, it is understood that the same calculation manner as the CRC calculation in the equation (2) can be used to each of them.

Specifically, in the calculation of the final terms of the F1 to F16 expressions, when it is assumed that the first data is $D_{209}$ to $D_{203}$, respectively, and fixed data "0" is entered in the following the clocks 15 to 0 (clock 15 in F1, clock 14 in F2, clock 13 in F3, and so forth and, clock 1 in F15, and clock 0 in F16), calculation can be executed in a manner similar to the equation (2). It is understood that the CRC bit can be calculated with respect to each of the partial data.

In principle, when each of the above-mentioned F1 to F16 is calculated by the equation (2) and the sum of remainders of them is obtained, data that is not originally interleaved but is deinterleaved by the deinterleaver 52 can be received in accordance with its order and the CRC calculation can be executed.

In this case, however, when the calculation of the equation (2) is executed by the CRC calculating circuit shown in FIG. 11, the calculation time is 208 cycles for the calculation of F1, 207 cycles for the calculation of F2, 206 cycles for the calculation of F3, and the like, which is almost equal to that of the CRC circuit 58. In total, the calculation time becomes nearly 16 times as long as that required for the CRC calculation on the interleaved data. The CRC calculation on the interleaved data and that on the non-interleaved data cannot be therefore simultaneously executed and some technique is necessary.

The inventors of the present invention have noted that data to be inserted during each term to be calculated is fixed and is always "0" in the above-described calculation of F1 to F16. Attention is paid to the following. Especially, when 16 clock cycles continue in such a manner that data is entered to the first term and "0" is entered to the following 15 terms, if the first state is known by the CRC circuit corresponding to the generation polynomial, the data in each CRC register after the 16 clock cycles can be preliminarily calculated and expressed in a simple form as a function of the data of the first CRC register. By using such a character, the result of the computation of 16 terms in all (data in the first term and "0" in the following 15 terms) performed in 16 clock cycles by the CRC circuit can be calculated in one cycle by using the above-described function. In the specification, a computation of the process, which is performed in 16 clock cycles by the conventional CRC circuit, in one clock cycle by using the function obtained in advance will be called a "16-clock-cycle computation".

Figure 3:
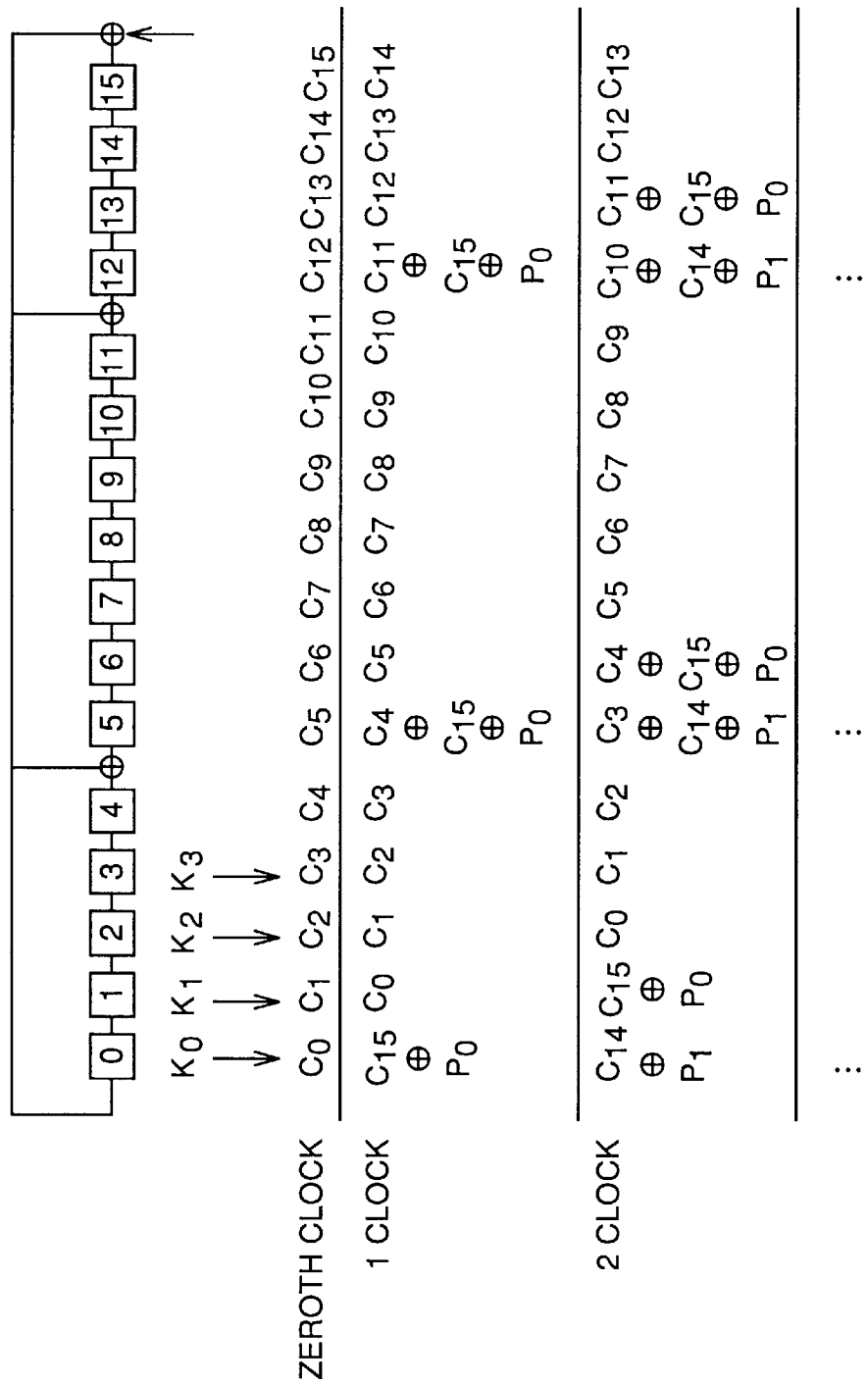
FIG. 3 is a diagram for explaining the principle of a new CRC circuit 60.

How the 16-clock-cycle computation is preliminarily executed will be described by referring to FIG. 3. The uppermost row in FIG. 3 shows the configuration of a CRC calculating circuit corresponding to the already described generation polynomial $x^{16}+x^{12}+x^5+1$. On the basis of the configuration of the CRC calculating circuit corresponding to the generation polynomial, when the state transition of each of CRC registers in the CRC calculating circuit is examined in order as follows, and the expression of the 16-clock-cycle computation can be obtained.

First, it is assumed that the data in the CRC registers (16 in all) in the 0th clock (initial state) is C0 to C15, respectively. It is assumed that data entered for the first time is P0. The data in the CRC register 15 is added to the data P0 (by using 2 as a modulus) by an adder in an input unit. The data in the CRC registers in the first clock is shown in the row described as "first clock" in FIG. 3. For example, the value of the CRC register 0 is expressed as "C15✖P0" (where the symbol "✖" denotes addition using 2 as a modulus, it should be noted that the symbol is different from that in the drawing). Similarly, the values of the CRC registers 1, 2, 3, and 4 are C0, C1, C2, and C3, respectively. The data in the CRC register 5 is the result of addition using 2 as a modulus performed between the result C15✖P0 and the data C4 in the CRC register 4, the result C15✖P0 being of the addition using 2 as a modulus between the input data P0 and the CRC register. Therefore, it is expressed as C4✖C15 ✖P0. Similarly, each of the data in all the CRC registers can be expressed by the value of the first CRC register and the input data P0.

The same holds for the second and subsequent clocks. When data entered in the second clock is P1, the data in the CRC register 0 is C14/✖P1, the data in the CRC register 1 is C15✖P0. The data in the CRC registers 2, 3, and 4 is C0, C1, and C2, respectively. The data in the CRC registers 5 and 6 is C3✖C14✖P1 and C4✖C15✖P0, respectively. Similarly, each of the data of all the CRC registers is determined by the value of each of the CRC registers in the zeroth dock and the input data P0 and P1.

Similarly, the data in each of the CRC registers in the following clock cycle can be expressed by the data of each of the CRC registers in the immediately preceding clock cycle and the value of the data entered in the clock cycle. By repeating the operation to the 16th clock cycle, the data in the CRC registers after the 16th clock cycle can be expressed by the initial value of each of all the CRC registers and input data P0 to P15. By using "0" as P1 to P15, the calculation can be easily executed.

The person skilled in the art can easily understand that, by the 16-clock-cycle computation as described above, assuming that each of P1 to P15 is known as 0, the data of all the CRC registers after the 16th clock cycle can be calculated in one clock cycle at the time point when P0 is entered.

By using the 16-clock-cycle computation, for example, with respect to the expression F1, calculation of all data is carried out by the 16-clock-cycle computation executed in one cycle to obtain F1 mod G(x). The number of terms (data) included in the expression F1 is 14 ($D_0, D_{16}, D_{32}, \ldots, D_{208}$), so that the result of the expression F1 is calculated in 14 cycles in all. As described above, it is $\frac{1}{16}$ of 208 cycles required for calculation by the CRC circuit.

F2 will now be examined. In F2, the first 13 terms can be calculated by the 16-clock-cycle computation. With respect to the last term, however, only fourteen (not fifteen) "0" continues after that. The last "0" is entered in the 15th cycle, not after 16 cycles. In this case, the above-described 16-clock-cycle computation cannot be used.

Referring to the diagram (FIG. 3) for performing the 16-clock-cycle computation, however, it is understood that the data of the CRC registers is similarly already calculated after 15 clock cycles in the process of calculating the 16-clock-cycle computation. It will be called a 15-clock-cycle computation in a manner similar to the 16-clock-cycle computation. In the case of F2, while supplying 14 data of $D_1, D_{17}, \ldots, D_{193}, D_{209}$ as data every cycle, the 16-clock-cycle computation is performed total 13 times, once in each of the first 13 cycles, and the 15-clock-cycle computation is executed once in the final clock cycle, thereby obtaining F2 mod G(x).

Similarly, with respect to F3, by the 16-clock-cycle computation of 13 times and a 14-clock-cycle computation of once, F3 mod G(x) is obtained. With respect to F4, by the 16-clock-cycle computation of 13 times and a 13-clock-cycle computation of once, F4 modG(x) is obtained. Similarly, with respect to Fi, by the 16-clock-cycle computation of 13 times and an m-clock-cycle computation of once (m=17−i), Fi mod G(x) is obtained. As described above, by adding all of Fi mod G(x) (i=1 to 16), F mod G(x) can be calculated. The number of clock cycles required for the calculation is (14×16=) 224 which coincides with the number of clock cycles necessary for the CRC calculation on the interleaved data.

By the circuit realizing such a principle, the CRC calculation on the data which is not interleaved can be executed in parallel in the same time as that required for the CRC calculation on the interleaved data.

Each of the 16-clock-cycle computation, 15-clock-cycle computation, . . . , 1-clock-cycle computation can be determined by depending only on the polynomial of generating the cyclic code and the number of interleave stages of the expected interleaving irrespective of given data. The computation in which the data is determined will be called a "clock cycle computation". The number of kinds of the clock cycle computations equal to the number of interleave stages exist.

Figure 4:
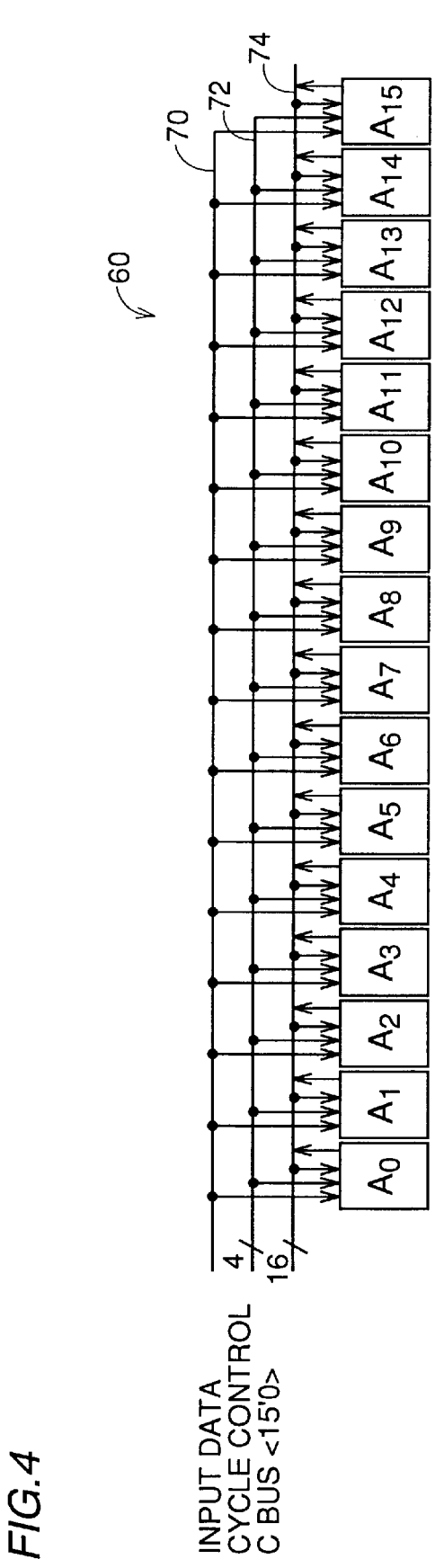
FIG. 4 is a block diagram showing the configuration of the new CRC circuit 60.

FIG. 4 shows a example of the configuration of the above-described new CRC circuit 60. Referring to FIG. 4, the new CRC circuit 60 includes: partial CRC calculating circuits A0 to A15 provided of the number corresponding to the maximum degree (16) of a CRC cyclic code generation polynomial, for calculating each of the bits of the CRC and holding the result; an input data line 70 for supplying input data to the partial CRC calculating circuits; a C bus 74 as a data supply path among the partial CRC circuits; and a cycle control signal line 72 to which a cycle control signal for designating a computation sequence by designating a computation to be performed from the 16-clock-cycle computation, 15-clock-cycle computation, and the like to the partial CRC circuits is supplied.

Figure 5:
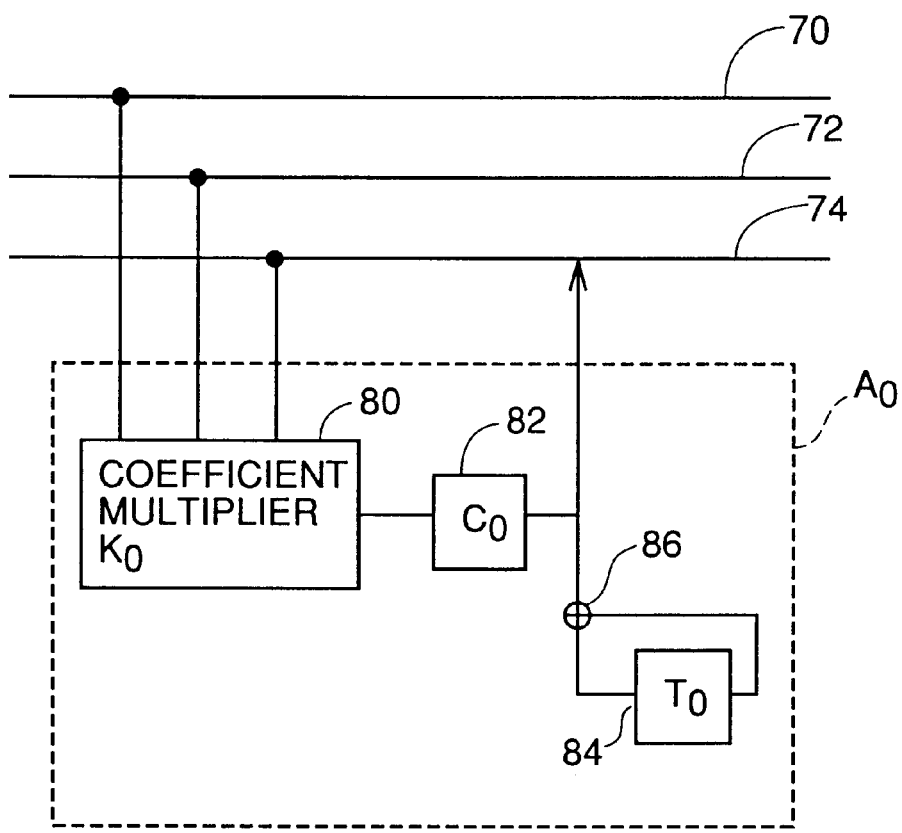
FIG. 5 is a block diagram of a partial CRC calculating circuit used for the new CRC circuit 60.

Referring to FIG. 5, the partial CRC calculating circuit A0 includes: a coefficient multiplier 80 which is connected to the input data line 70, the cycle control signal line 72, and the C bus 74, selects any one of the 16-clock-cycle computation to the 1-clock-cycle computation in accordance with the cycle control signal on the cycle control signal line 72, executes the selected computation on a predetermined CRC bit on the C bus 74 and deinterleaved input data supplied via the input data line 70, and outputs the result; a CRC register 82 having an input connected to the output of the coefficient multiplier 80 and an output connected to one of signal lines of the C bus 74, for holding one bit outputted from the coefficient multiplier 80 among partial CRC check bits for the partial data and outputting the bit onto a corresponding signal line on the C bus 74; a temporary CRC register 84 for storing intermediate results of the CRC bit calculation by the partial CRC calculating circuit A0, of only the number (i) in the expression (5) which corresponds to the number of interleaving stages (16 in the example shown in FIG. 10); and an adder 86 for performing addition between the data in the CRC register 82 and the data in the temporary CRC register 84 by using 2 as a modulus and supplying the result as an intermediate result of the CRC calculation to the temporary CRC register 84.

Each of the other partial CRC calculating circuits A1 to A15 has the same configuration as that of the partial CRC calculating circuit A0 except that a signal line in the C bus 74, to which the CRC register 82 is connected varies. Therefore, the detailed description of the circuits will not be repeated here.

The coefficient multiplier 80 can execute any of the above-described 16-bit to 1-bit computations and selects and executes any one of the computations in accordance with the instruction by the cycle control signal on the cycle control signal line 72. At this time, the input data on the input data line 70 and the data on the C bus 74 to be used varies according to the partial CRC calculating circuit for calculating which bit and the number of bits of the computation instructed by the cycle control signal on the cycle control signal line 72.

At any rate, the coefficient multiplier 80 executes the computation instructed by the cycle control signal on the cycle control signal line 72 in one cycle of the clock signal and supplies the result to the CRC register 82. The CRC register 82 holds the output and outputs it onto the C bus 74. As described above, after performing the 16-dock-cycle computation 13 times and any of the 16-clock-cycle to 1-clock-cycle computations corresponding to the number of remaining data once, a bit corresponding to the partial CRC calculating circuit among CRC(Fi mod G(x)) obtained for F1 to F16 is stored in the CRC register 82. A computation is performed between the bit and a value stored in the temporary CRC register 84 by using 2 as a modulus and the result is stored again in the temporary CRC register 84, thereby storing an intermediate result of the CRC calculation to the temporary CRC register 84.

The mobile unit 20 of the embodiment of the present invention shown in FIGS. 1, 2, 4 and 5 operates as follows. At the time of reception, the RF unit 30 receives radio waves from the base station and supplies the radio waves to the demodulating unit 32. The demodulating unit 32 demodulates the reception signal and supplies the demodulated signal to the channel decoding unit 34. The channel decoding unit 34 performs the channel decoding process on the channel demodulated data and supplies the decoded data to the error control decoding unit 36. At this time, whether the received data is interleaved or not cannot be immediately determined.

The error control decoding unit 36 conducts the CRC check on the data as follows. Referring to FIG. 2, the data once stored in the reception data buffer 50 is read by the deinterleaver 52 from the reception data buffer 50 in accordance with the order indicated by the arrows 132 in FIG. 10 (that is, subjected to the deinterleaving process), and supplied to the FECs 54 and 56. For simplicity of explanation, the following description will be given on the assumption that the data is supplied via the FECs 54 and 56 directly to the CRC circuit 58 and the new CRC circuit 60, respectively.

The CRC circuit 58 executes a CRC calculating process similar to the conventional one on the data supplied in the same conventional fashion on the assumption that the data is interleaved one. In parallel, simultaneously, the new CRC circuit 60 executes the CRC calculation on the assumption that the data is non-interleaved data in accordance with the principle shown in FIG. 3. The operation of the new CRC circuit 60 will be described later. The CRC calculation by the CRC circuit 58 and the CRC calculation by the new CRC circuit 60 are finished almost simultaneously. When there is no CRC error in the CRC calculation by the CRC circuit 58, an output of the CRC circuit 58 is supplied to the CPU 38 where, for example, reproduction of sound or the like is performed. When there is a CRC error in the CRC calculation by the CRC circuit 58, the result of the CRC calculation in the new CRC circuit 60 is checked. When there is no CRC error, the result of the new CRC circuit 60 is supplied to the CPU 38. When there is a CRC error, a necessary error process such as a data retransmission request to the base station is performed.

Figure 6:
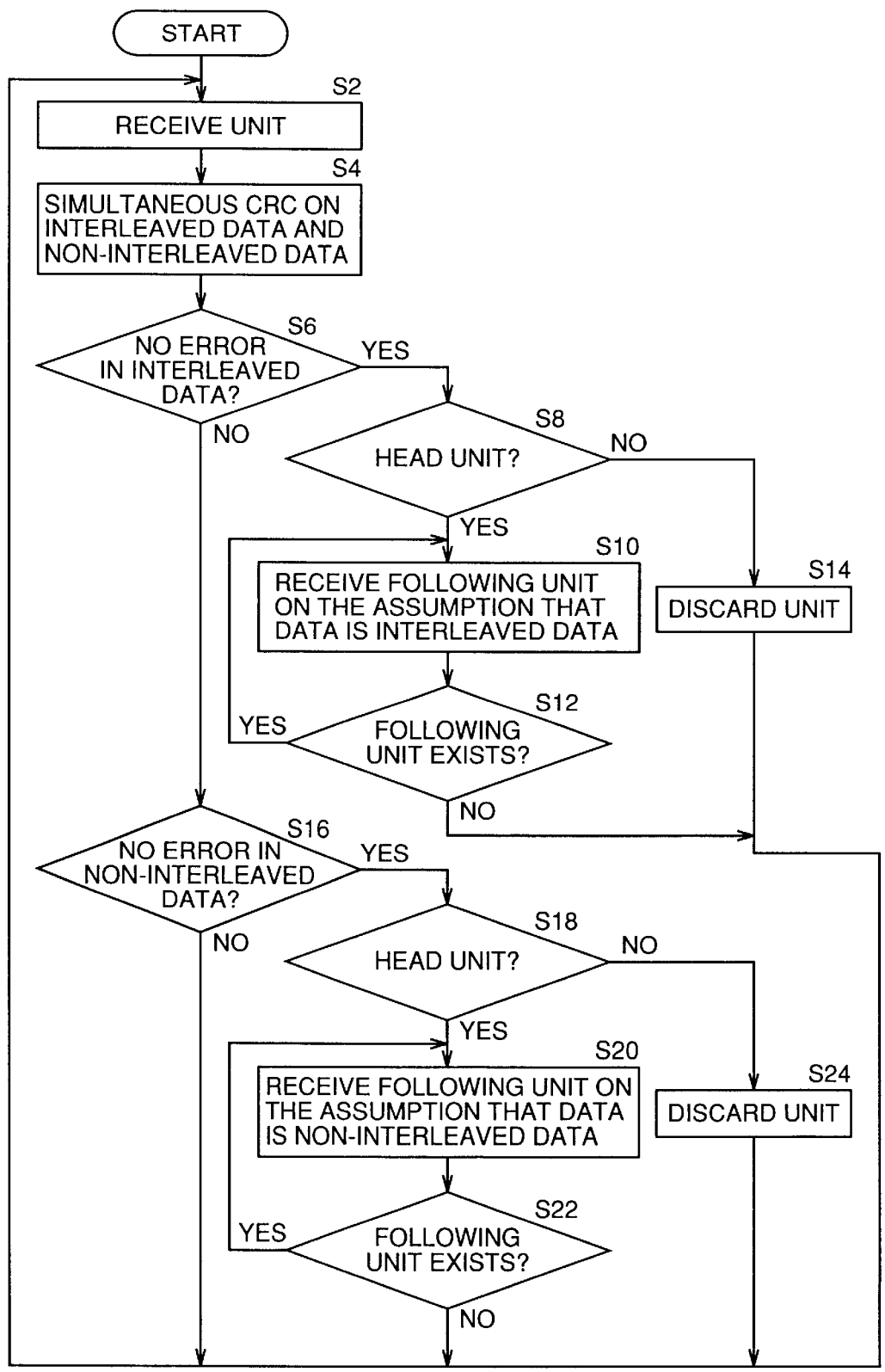
FIG. 6 is a flowchart showing processes performed by an error control decoding unit 36 in the embodiment of the invention.
Figure 7:
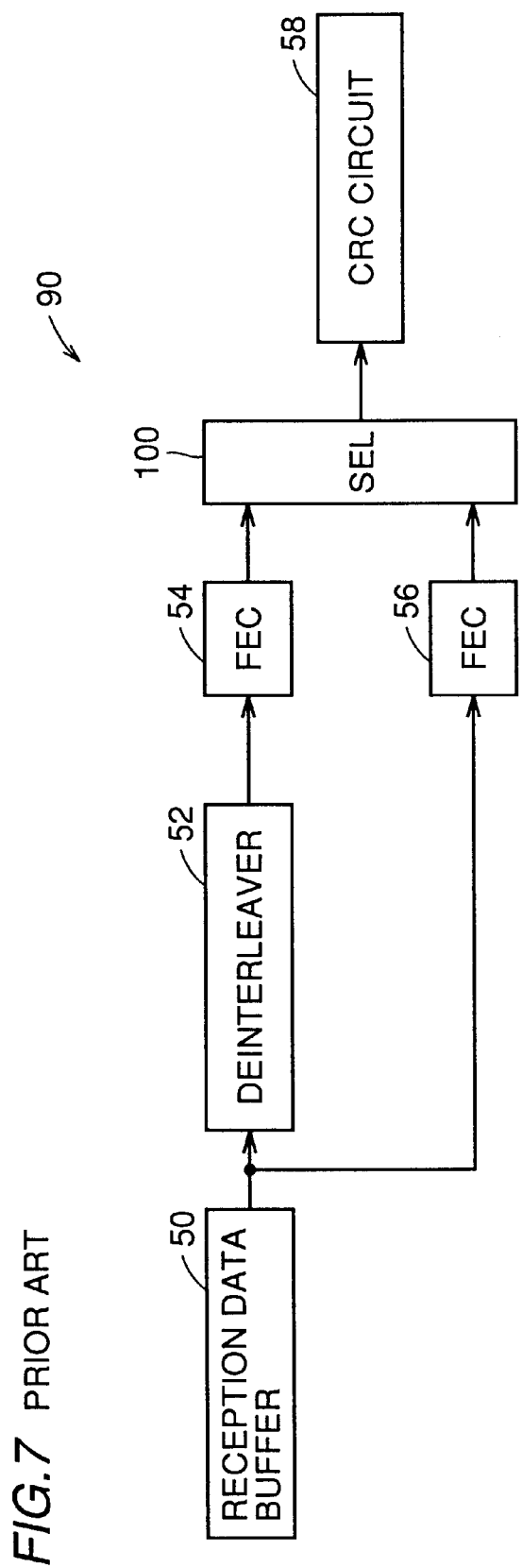
FIG. 7 is a block diagram of a conventional error control decoding unit 90.
Figure 8:
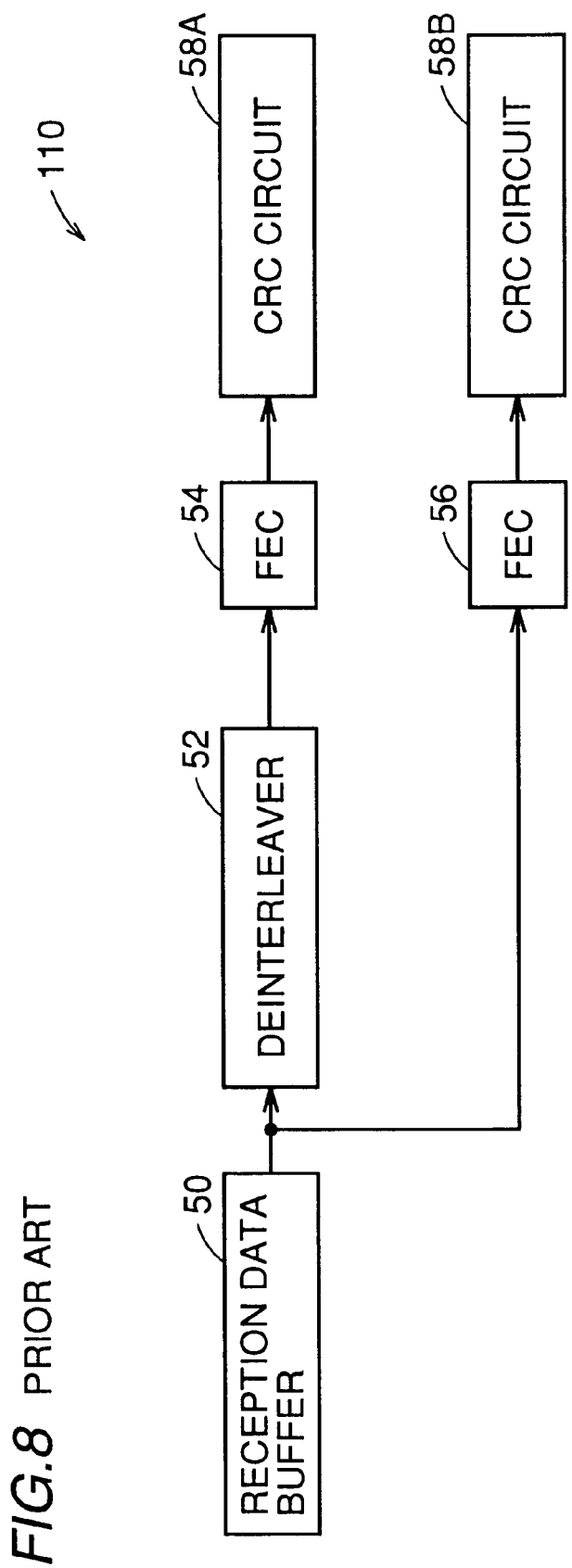
FIG. 8 is a block diagram of a conventional error control decoding unit 110.

Referring to FIG. 6, the CRC control in the error control decoding unit 36 is carried out in accordance with the following control structure. First, the mobile unit is started and a unit is received (step S2). First, the data deinterleaved via the deinterleaver 52 shown in FIG. 2 is supplied to the CRC circuit 58 and the new CRC circuit 60 where the CRC processes are performed simultaneously (step S4). As a result, when there is no CRC error in the process of the CRC circuit 58 ("YES" in the determination of step S6), the control advances to step S8. When there is a CRC error in the process of the CRC circuit 58 ("NO" in the determination of step S6), the control advances to step S16.

When there is no CRC error in the CRC process in the CRC circuit 58, it means that the data transmitted from the base station is interleaved data. After that, the receiving process is performed on the condition that the data is interleaved. Specifically, first in step S8, whether the unit received in step S2 is the head unit or not is determined. When NO, the unit is discarded in step S14 and the control returns to step S2.

When it is determined in step S8 that the unit received in step S2 is the head unit, in step S10, on the assumption that the data is interleaved, the following unit is received, and the CRC process is performed. Subsequently, in step S12, whether there is a following unit or not is determined. If YES, the control returns to step S10 where the process of receiving the following unit is continued. When it is determined in step S12 that there is no following unit, the control returns to step S2.

On the other hand, when it is determined in step S6 that there is a CRC error in the CRC process by the CRC circuit 58, in step S16, whether there is a CRC error or not in the CRC process by the new CRC circuit 60 is determined. In this case, the determination has already substantially made in step S4, so that it is unnecessary to newly read the data which is not interleaved from the reception data buffer 50. When there is no CRC error as a result of the CRC process in the new CRC circuit 60, the data received in step S2 is determined as non-interleaved data, and the control advances to step S18. When there is a CRC error, without performing any operation (that is, the received unit is discarded), the control returns to step S2.

The processes in steps S18 to S24 performed when it is determined that there is no CRC error in step S16 are similar to those in steps S8 to S14, respectively. Their detailed description will not be consequently repeated here.

Figure 12:
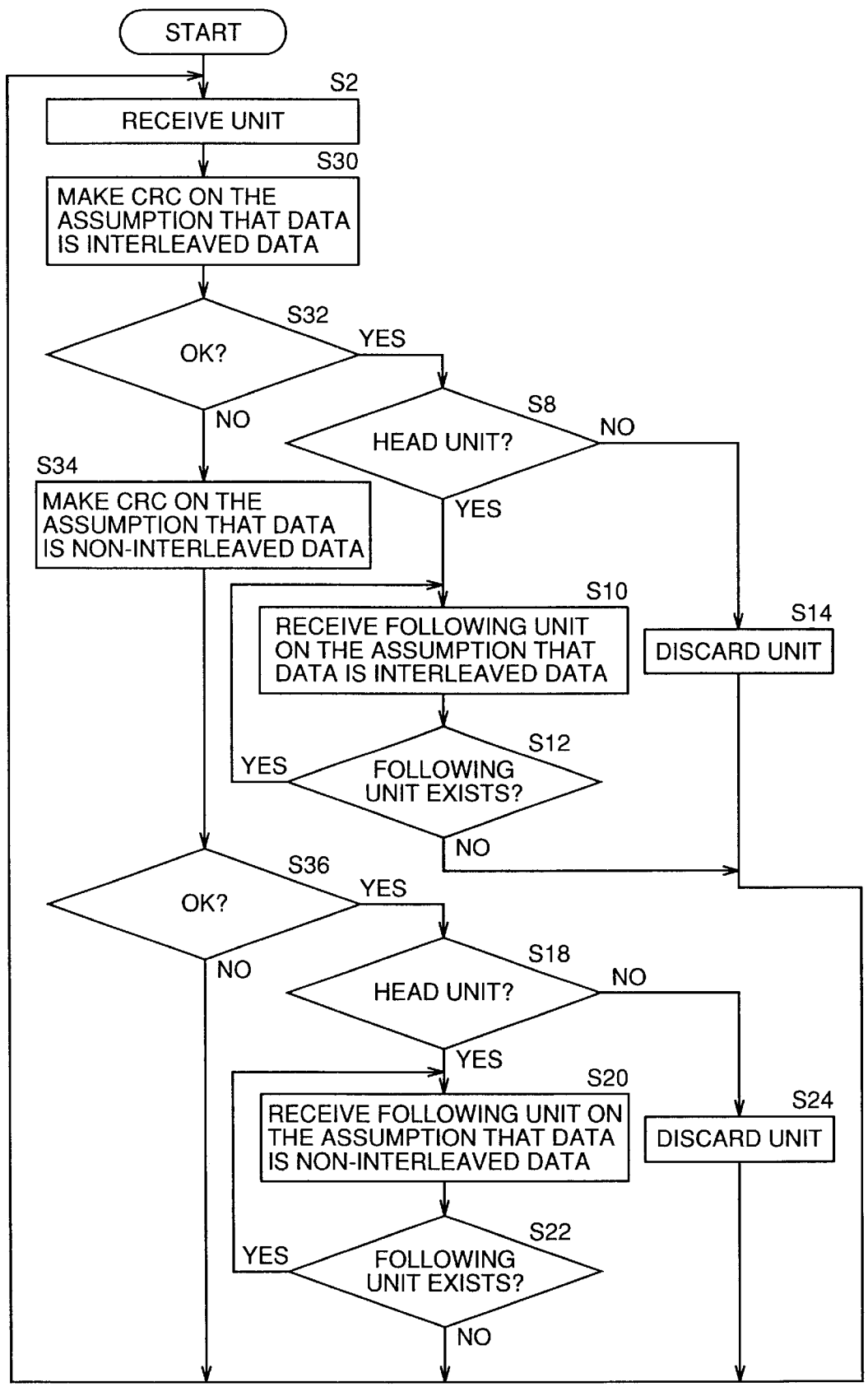
FIG. 12 is a flowchart showing processes performed by a conventional error control circuit decoding unit.

In the control structure, different from the conventional example shown in FIG. 12, even when it is determined that there is a CRC error in the CRC process by the CRC circuit 58, it is unnecessary to newly read the reception data from the reception data buffer 50. The processing time is shortened and the load on processes is lessened.

Referring to FIGS. 4 and 5, the new CRC circuit 60 operates as follows. As described above, when the deinterleaved reception data has been subjected to the 16-stage interleaving, it is read from the reception data buffer 50 in accordance with the order of $D_0, D_{16}, \ldots, D_{192}, D_{208}, D_1, D_{17}, \ldots, D_{193}, D_{209}, D_2, D_{18}, \ldots, D_{194}, D_{210}, \ldots, D_{15}, D_{31}, \ldots, D_{207},$ and $D_{223}$. A described above, the data is decomposed into the form of F1, F2, F3, . . . , and F15.

First, the temporary CRC for F1 is obtained as follows. The data of the CRC registers 82 in all the partial CRC calculating circuits A0 to A15 is initialized to a predetermined value, and all the temporary CRC registers 84 are cleared. When the first data $D_0$ is supplied via the input data line 70, the cycle control signal for instructing execution of the 16-clock-cycle computation is outputted onto the cycle control signal line 72. The coefficient multiplier 80 in each of the partial CRC calculating circuits A0 to A15 performs the computation corresponding to the 16-clock-cycle computation to the input data $D_0$ on the input data line 70 and predetermined one of the values in the CRC register 82 on the C bus 74, and outputs the result. The CRC register 82 stores the result of the computation of the corresponding coefficient multiplier 80. The processes up to here are performed in one cycle.

Subsequently, the data $D_1$ is entered. At this time as well, the cycle control signal for instructing the execution of the 16-clock-cycle computation is similarly outputted onto the cycle control signal line 72. The coefficient multiplier 80 in each of the partial CRC calculating circuits A0 to A15 performs the computation corresponding to the 16-clock-cycle computation on the input data $D_1$ on the input data line 70 and predetermined one of the values of the CRC registers 82 on the C bus 74, and outputs the result. The CRC register 82 stores the result of the computation of the corresponding coefficient multiplier 80. The process is performed in one cycle. That is, the processes up to here are performed in two cycles in total.

Similarly, the 16-clock-cycle computation is performed to the final term $D_{208}$. As a result, at the time point when the final term $D_{206}$ is entered, CRC1(x) as a temporary CRC for F1 is stored in the CRC registers 82 in the partial CRC calculating circuits A0 to A15. This is transferred to the temporary CRC register 84.

The next input data $D_1, D_{17}, D_{193}$, and $D_{209}$ relates to F2. First, only the coefficient multipliers 80 in the partial CRC calculating circuits A0 to A15 are initialized. The cycle control signal for instructing execution of the 16-clock-cycle computation when the first data $D_1$ is entered is outputted onto the cycle control signal line 72. In response to this, between the input data $D_1$ and the value stored in the coefficient multiplier 80, the 16-dock-cycle computation is performed in one clock cycle in each of the partial CRC calculating circuits A0 to A15. The result is stored in each of the coefficient multipliers 80. Subsequently, when the next data $D_{17}$ is entered, the 16-clock-cycle computation is similarly executed. The computation is similarly performed to the term ($D_{193}$) preceding to the final term ($D_{209}$).

With respect to the final term ($D_{209}$), as described above, the fixed value "0" continues fourteen times after that. For the final term, therefore, the cycle control signal for instructing the 15-clock-cycle computation is outputted to the cycle control signal line 72. In each of the partial CRC calculating circuits A0 to A15, the 15-clock-cycle computation is performed in one cycle by using the input data $D_{209}$ and the value of each of the coefficient multipliers 80, and the result is stored in each of the coefficient multipliers 80. Consequently, at the time point when the computation on the final term data is finished, CRC2(x) as a temporary CRC for F2 is stored as a whole. By executing addition using 2 as a modulus between CRC2(x) and CRC1(x) as a temporary CRC for F1 already stored in the temporary CRC register 84, CRC1(x)+CRC2(x)=(F1(x)+F2(x)) mod G(x) is obtained.

Similarly, the 14-clock-cycle computation to the 1-clock-cycle computation are performed only at the time of calculation of the final terms in F3 to F16 to thereby obtain temporary CRCs. Addition using 2 as a modulus is performed between each of the temporary CRCs and the value in the temporary CRC register 84. On completion of the computations on all the data, (F1(x)+F2(x)+F3(x)+. . . + F15(x)+F16(x)) mod G(x), that is, the CRC of the data in the non-interleaving format is obtained in the temporary CRC register 84. By reading out the value, the presence or absence of the CRC error in the data in the non-interleave format can be determined.

The above processes of the new CRC circuit 60 can be performed in the same time as that of the CRC calculation of the data in the interleave format by the CRC circuit 58 as already described. Therefore, by the data read from the reception data buffer 50 by the deinterleaver 52 on the assumption that the data is in the interleave format, the non-interleave CRC result and the interleave CRC result can be simultaneously obtained. By using the result, the CPU 38 performs reproduction of transmission data or the like and further transmits data to be sent to the base station from the RF unit 30 via the error control coding unit 40, channel coding unit 42, and modulating unit 44.

According to the embodiment as described above, even when whether data transmitted from the base station is data in the interleave format or not is known, by reading the data only once on the assumption that the data is interleaved data, the non-interleave CRC result and the interleave CRC result are obtained simultaneously. Consequently, irrespective of whether the reception data is interleaved data or not, whether the reception data is interleaved data or not can be known by the computation of only once. Thus, effects such that the load of the computation is reduced and, moreover, the consumption power of the mobile unit can be suppressed are produced.

It should be noted that the embodiments disclosed above are illustrative but not restrictive with respect to any points. The scope of the invention is defined by the scope of the claims, not by the foregoing embodiment and examples, and includes all corrections and modifications within the scope of claims or equivalence of the scope of the claims.

As described above, according to the error control circuit of the invention, whether received data is interleaved data or not can be determined by reading the reception data only once and the time required for the determination is equal to the time required to determine that the received data is interleaved one when the data is interleaved. The error control circuit of the invention is therefore suitable for a communication system in which the base station switches transmission of data in either an interleave format or a non-interleave format in accordance with line quality, and data indicative of the presence or absence of interleaving is not attached to reception data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error control circuit including:

a deinterleaver for deinterleaving data of a predetermined number of bits coded by predetermined cyclic codes and to be interleaved in accordance with a predetermined interleave order;

a first cyclic code checking circuit for receiving an output of said deinterleaver and conducting a cyclic code check on said data of the predetermined number of bits by a check system corresponding to a coding system of said cyclic code; and a second cyclic code checking circuit for receiving an output of said deinterleaver and conducting a cyclic code check on said data of the predetermined number of bits by a check system corresponding to the coding system of said cyclic code simultaneously with the cyclic code check by said first cyclic code checking circuit in substantially the same time while canceling an interleave effect by said deinterleaver.

2. The error control circuit according to claim 1, wherein said second cyclic code checking circuit includes:

an input data line connected to an output of said deinterleaver;

a data bus including data signal lines of the number corresponding to the maximum degree of a polynomial of generating said cyclic code;

a plurality of partial check bit calculating circuits each connected to said input data line and said data signal line, which are provided in correspondence with the maximum degree of a polynomial of generating said cyclic code, for calculating a check bit in a predetermined position of said cyclic code by executing a predetermined computation sequence determined by the coding system of said cyclic code and a system of said interleave on data supplied from said input data line and data on said data signal line; and computation control means connected to each of said plurality of partial check bit calculating circuits, for controlling the computation sequence to be performed by said partial check bit calculating circuits.

3. The error control circuit according to claim 2, each of said plurality of partial check bit calculating circuits includes:

computating means connected to said computation control means, said input data line, and said data bus, for executing a computation determined by a computation instruction signal supplied from said computation control means on data on said input data line and data on a predetermined data line on said data bus;

data holding means having an input connected to an output of said computating means and an output connected to a predetermined data line on said data bus, for holding data outputted from said computating means and outputting the data onto said predetermined data line; and computation result holding means connected to an output of said data holding means, for executing a computation using 2 as a modulus between data held by itself and an output of said data holding means each time computations of the number corresponding to a number obtained by dividing said predetermined number of bits by the number of stages of said interleave are finished.

4. The error control circuit according to claim 3, wherein said computating means can execute clock cycle computations determined by said generation polynomial, of only the number of kinds corresponding to the number of interleave stages of said interleave.

5. The error control circuit according to claim 4, wherein said computation designation signal designates any of said clock cycle computations.

6. The error control circuit according to claim 1, wherein said cyclic code is a 16-bit CRC code.

7. The error control circuit according to claim 1, wherein said interleave is 16-stage interleave.

8. An error control method including:

a step of deinterleaving data of a predetermined number of bits coded by predetermined cyclic codes and to be interleaved in accordance with a predetermined interleaving order;

a step of receiving data deinterleaved in said deinterleaving step, and conducting a first cyclic code check on said data of the predetermined number of bits by a check system corresponding to a coding system of said cyclic code; and a step of receiving said deinterleaved data and conducting a second cyclic code check on said data of the predetermined number of bits by a check system corresponding to the coding system of said cyclic code simultaneously with the step of conducting said first cyclic code check in substantially the same time.

9. The error control method according to claim 8, wherein said step for conducting said second cyclic code check includes:

a step of initializing a plurality of temporary cyclic check data holding means of the number corresponding to the maximum degree of a polynomial of generating said cyclic code; and a step of calculating a check bit in each of positions of said cyclic codes by performing a computation sequence made by a plurality of clock cycle computations determined by a coding system of said cyclic code and said interleave system on data deinterleaved in said deinterleaving step while using said plurality of temporary cyclic check data holding means.

10. The error control method according to claim 9, wherein a number obtained by dividing said predetermined number of bits by the number of interleave stages of said interleave represents the number of data in an interleave stage, data of said predetermined number of bits is divided into plural partial data every said number of data in said interleave stage, and the step of calculating a check bit in said each position includes:

a step of performing a process of calculating temporary cyclic check data every said plural partial data; and a step of obtaining cyclic check data of said predetermined number of bits by adding the temporary cyclic check data calculated every said partial data.

11. The error control method according to claim 10, wherein a plurality of kinds of clock cycle computations include computations from a 1clock-cycle computation to a maximum degree clock cycle computation corresponding to the number of stages of said interleave, and a number corresponding to each of the positions of said predetermined number of bits is designated to each of said plural partial data, and a process of calculating said temporary cyclic check data includes:

a step of initializing plural data holding means of the number corresponding to the maximum degree of the polynomial of generating said cyclic code to a predetermined initial value;

a step of performing clock cycle computations of said maximum degree on input data and data held in said plural data holding means and repeating a process of holding a result in each of bits of said plural data holding means only by the number smaller than the number of said interleave stages by one; and a process of performing said clock cycle computation determined by a number given to said partial data on input data and data held in said plural data holding means and holding the result in each of bits in said plural data holding means.

12. The error control method according to claim 11, wherein the step of calculating cyclic check data of said data of the predetermined number of bits includes a step of performing addition using 2 as a modulus between data held in each of said plural data holding means and data held in corresponding one of said plural temporary cycle check bit holding means and holding a result of the addition in said corresponding temporary cycle check bit holding means.

13. The error control method according to claim 8, wherein said cyclic code is a 16-bit CRC code.

14. The error control method according to claim 8, wherein said interleave is 16-stage interleave.

\* \* \* \* \*